United States Patent
Lin et al.

(10) Patent No.: US 10,811,092 B1
(45) Date of Patent: Oct. 20, 2020

(54) RRAM WITH PLURALITY OF 1TNR STRUCTURES

(71) Applicant: Winbond Electronics Corp., Taichung (TW)

(72) Inventors: Chi-Shun Lin, San Jose, CA (US); Chuen-Der Lien, San Jose, CA (US); Douk-Hyoun Ryu, San Jose, CA (US); Ming-Huei Shieh, San Jose, CA (US); Seow Fong Lim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/542,306

(22) Filed: Aug. 16, 2019

(51) Int. Cl.
*G11C 13/00* (2006.01)
*H01L 27/24* (2006.01)

(52) U.S. Cl.
CPC ........ *G11C 13/0026* (2013.01); *G11C 13/004* (2013.01); *G11C 13/0069* (2013.01); *H01L 27/2436* (2013.01); *H01L 27/2463* (2013.01); *G11C 2013/005* (2013.01); *G11C 2213/75* (2013.01); *G11C 2213/79* (2013.01)

(58) Field of Classification Search
CPC .............. G11C 13/0026; G11C 13/004; G11C 13/0069; H01L 27/2436; H01L 27/2463
See application file for complete search history.

(56) References Cited

U.S. PATENT DOCUMENTS

| | | | |
|---|---|---|---|
| 7,933,136 B2 | 4/2011 | Carter et al. | |
| 8,305,795 B2 * | 11/2012 | Azuma | G11C 13/0007 365/148 |
| 9,424,914 B2 * | 8/2016 | Shieh | G11C 13/0002 |
| 2016/0078937 A1 * | 3/2016 | Hung | G11C 13/0069 365/148 |

FOREIGN PATENT DOCUMENTS

| | | |
|---|---|---|
| CN | 103165172 | 8/2015 |
| TW | I576842 | 4/2017 |

* cited by examiner

*Primary Examiner* — Tri M Hoang
(74) *Attorney, Agent, or Firm* — JCIPRNET

(57) ABSTRACT

The disclosure is directed to a RRAM having a plurality of 1TnR structures. In an aspect, the disclosure provides a RRAM including a plurality of 1TnR structures which includes a first 1TnR structure which includes a first transistor having a first gate terminal connected to a first word line, a first drain terminal, and a first source terminal connected to a source line, wherein the source line is connected to each of the plurality of 1TnR structures; and a first N parallel resistors group including a first resistor and a second resistor which are connected to the first drain terminal and connected to each other in parallel, wherein the first resistor is connected to a first bit line, the second resistor is connected to a second bit line, and N is an integer greater than one.

20 Claims, 8 Drawing Sheets

100

US 10,811,092 B1

RRAM WITH PLURALITY OF 1TNR STRUCTURES

TECHNICAL FIELD

The disclosure is directed to a resistive random-access memory (RRAM) having a plurality of one transistor n resistors (1TnR) structures.

BACKGROUND

RRAM is an emerging non-volatile memory technology that exhibits high cell density and low standby power. A RRAM chip is typically used as a non-volatile storage memory device which could be packaged as an integrated circuit. The RRAM chip could be a part of a stand-alone device or a removable device plugged into another electronic device or a part of an integrated circuit (IC) operating in conjunction with a microprocessor, a microcontroller, and etc. A recent RRAM architecture has adopted a one-transistor-one-resistor (1T1R) architecture, a one-transistor-multiple-resistor (1TnR) architecture, or a combination of both, where n is an integer greater than 1. In order to further increase the density of the RRAM, the area of a 1TnR array may further undergo miniaturization by making alterations in the circuit level or in the device layout level.

SUMMARY OF THE DISCLOSURE

Accordingly, the disclosure is directed to a RRAM having a plurality of one transistor n resistors (1TnR) structures.

In an aspect, the disclosure is directed to a resistive random-access memory (RRAM) which includes a plurality of one transistor n resistors (1TnR) structures including a first 1TnR structure which includes: a first transistor including a first gate terminal connected to a first word line, a first drain terminal, and a first source terminal connected to a source line, wherein the source line is connected to each of the plurality of 1TnR structures; and a first N parallel resistors group including a first resistor and a second resistor which are connected to the first drain terminal and connected to each other in parallel, wherein the first resistor is connected to a first bit line, the second resistor is connected to a second bit line, and N is an integer greater than one.

In an aspect, the disclosure is directed to a resistive random-access memory (RRAM) which includes a plurality of one transistor n resistors (1TnR) structures including a first 1TnR structure and a second 1TnR structure connected to the first 1TnR structure in parallel, wherein the first 1TnR structure includes: a first transistor including a first gate terminal connected to a first word line, a first drain terminal, and a first source terminal connected to a source line, wherein the source line is connected to the second 1TnR structure; and a first N parallel resistors group including a first resistor and a second resistor which are connected to the first drain terminal and connected to each other in parallel, wherein the first resistor is connected to a first bit line, the second resistor is connected to a second bit line, and N is an integer greater than one.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also, the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
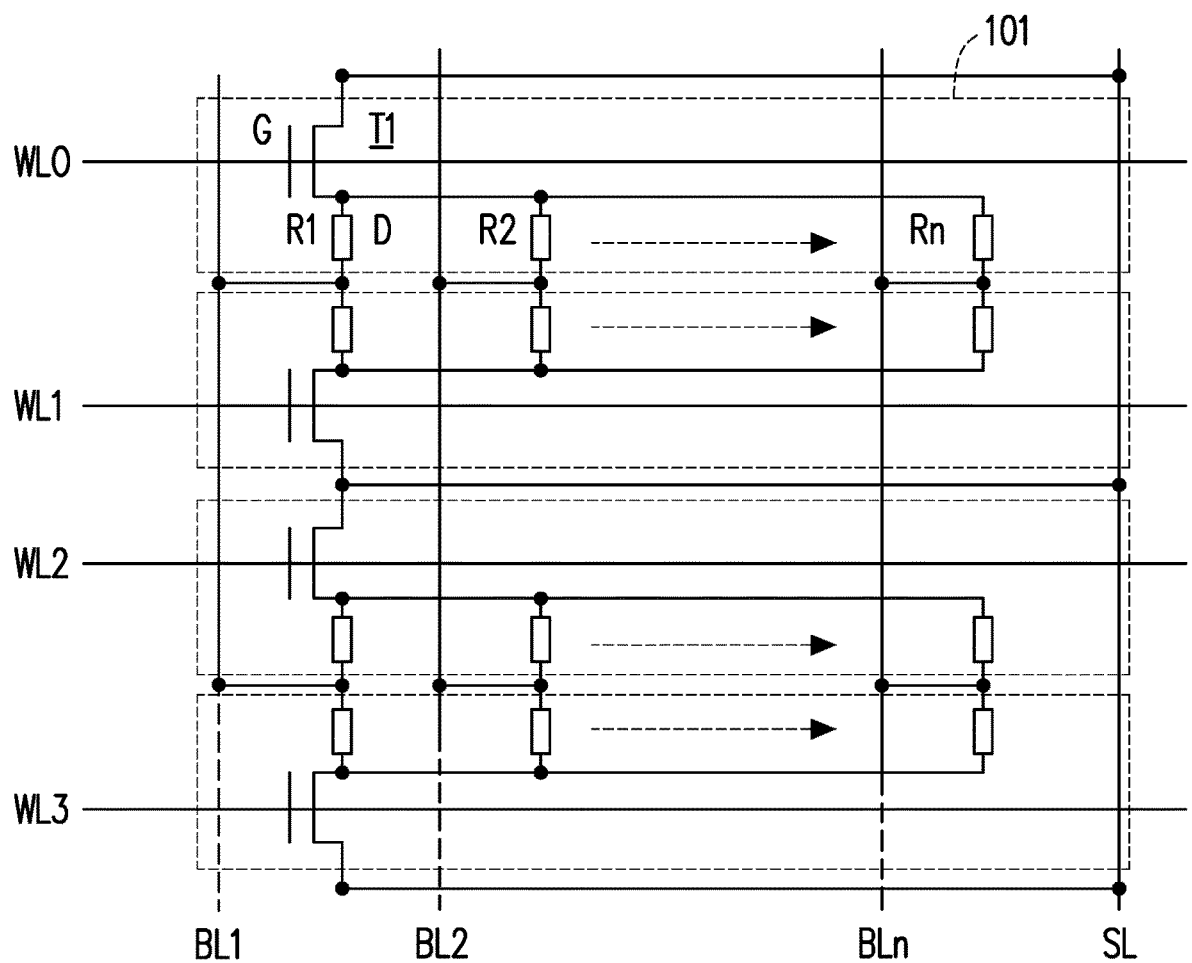
FIG. 1 illustrates a RRAM having a plurality of 1TnR structures in accordance with one of the exemplary embodiments of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

The disclosure proposes a RRAM which utilizes a 1TnR architecture in order to further achieve device miniaturization by reducing the size of RRAM cell areas and also to increase its performance. FIG. 1 shows a plurality of 1TnR structures as each 1TnR structurer contains a transistor and a group of n resistors which represents a group of n physical bits or n different memory cells. For example, a first transistor T1 of a first 1TnR structure 101 includes a gate terminal connected to a first word line WL0, a source terminal connected to a source line SL, and a drain terminal connected to the group of n resistors. Each resistor of the group of n resistors could be a cell, is connected to a different bit line, and may store a binary value having a logic 1 or a logic 0.

In the example of FIG. 1, a first bit line BL1 is connected to a first resistor R1, a second bit line BL2 is connected to a second resistor R2, the $n^{th}$ bit line BLn is connected to the $n^{th}$ resistor Rn, and so forth. Each of the different bit lines (BL1, BL2, . . . , BLn), each of the different word lines (WL0, WL1, WL2, WL3) could be controlled to select one or more of the resistors (R1, R2, . . . , Rn) by creating a low impedance path along a resistor or to unselect one or more of the resistors (R1, R2, . . . , Rn) by creating a high impedance path along a resistor. For example, by selecting a memory cell which corresponds to the R1 resistor for a read operation, the voltage of the word line WL0 could be configured to pull high to turn on the gate terminal of the transistor T1 and the voltage of the source line SL could be pull high so as to create a low impedance state for the R1 resistor in order for the binary value stored in the R1 resistor to be read.

The disclosure provides two different embodiments for the RRAM as each embodiment utilizes a slightly different 1TnR architecture. The first exemplary embodiment involves a plurality of 1TnR structures sharing a source line which is in parallel to a plurality of bit lines. The second exemplary embodiment involves a plurality of 1TrR structures sharing a common source line which is in perpendicular to a plurality of bit lines. The principle of operations of each of the exemplary embodiments will be elucidated with further details.

Figure 2:
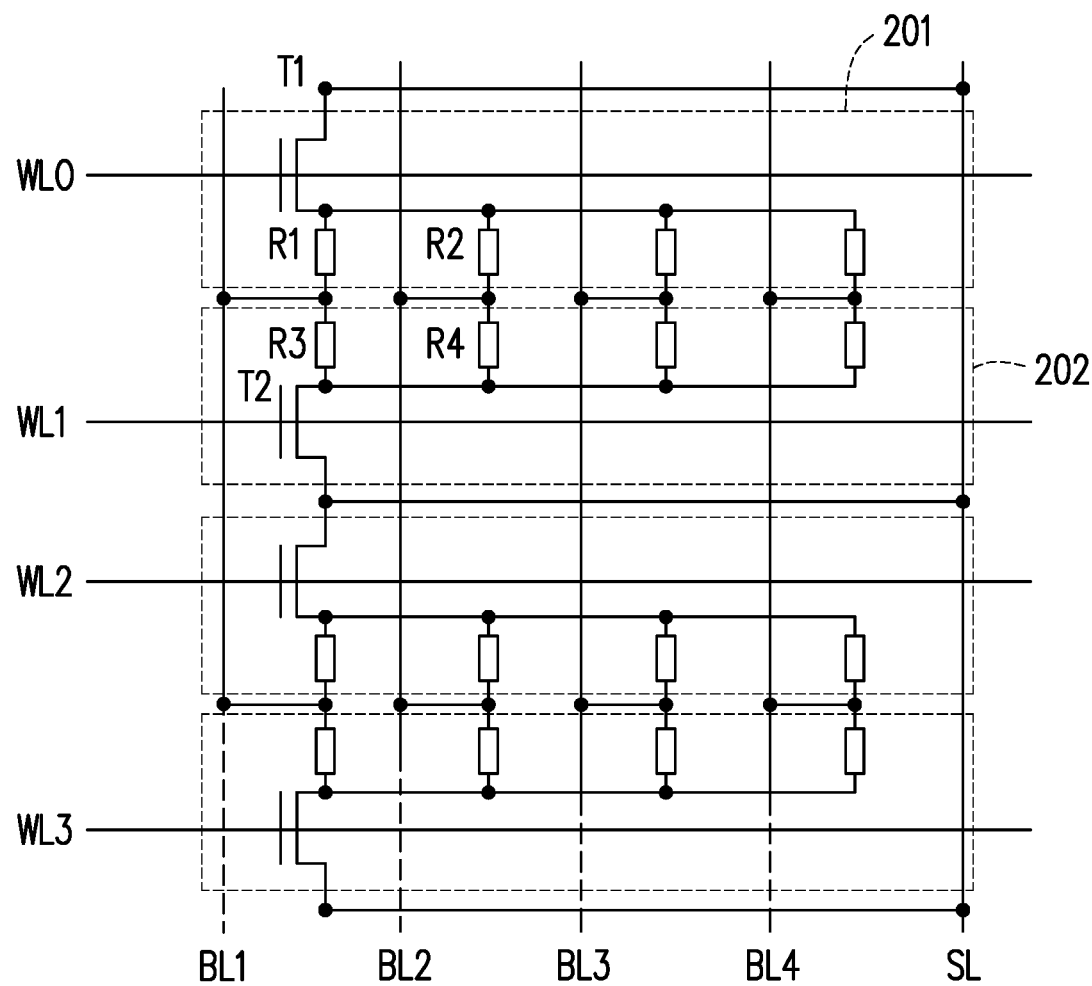
FIG. 2 illustrates a RRAM having a plurality of 1T4R structures in accordance with a first exemplary embodiment of the disclosure.

FIG. 2 shows a RRAM having a plurality of 1T4R structures based on the first exemplary embodiment of the disclosure. The RRAM of FIG. 2 includes multiple 1T4R structures which include a first 1T4R structure 201 and a second 1T4R structure 202. The first 1T4R structure 201 includes a first transistor T1 having a first gate terminal connected to a first word line WL0, a first drain terminal, and a first source terminal connected to a source line SL. The source line is parallel to the nR bit lines and common access to each of the plurality of 1TnR structures on the same SL. The first 1T4R structure 201 also includes a first group of n resistors which is the group of parallel resistors connected to the drain terminal including, for example, a first resistor R1 and a second resistor R2 where the first resistor R1 is connected to a first bit line BL1, the second resistor R2 is connected to a second bit line BL2, and so forth.

The second 1T4R structures 202 would include a second transistor T2 which includes a second gate terminal connected to a second word line WL1, a second drain terminal, and a second source terminal connected to the source line SL. The second 1T4R structures 202 would also include a second n parallel resistors group which includes a third resistor R3 and a fourth resistor R4 which are connected to the second drain terminal and connected to each other in parallel, where R3 is connected to the BL1, R4 is connected to BL2, R3 is connected to R1 in series, and R4 is connected to R2 in series.

The SL is connected to and shared among all the 1T4R structures of FIG. 2. In order to select a cell, one of the word lines (WL0, WL1, WL2, WL3) which corresponds to the cell could be configured to be pulled high. The source line could be set high for a read operation, set low for a set operation, or set high for a reset operation. A resistor cell could be then be accessed from its corresponding bit lines. For example, R1 could be accessed from BL1 by creating a low impedance along R1; otherwise, the R1 would be in a high impedance state. It should be noted that, for the first exemplary embodiment, n is equal to 4 solely for illustration purposes but this disclosure does not limit n to 4 as n could be any number greater than 1.

Figure 3:
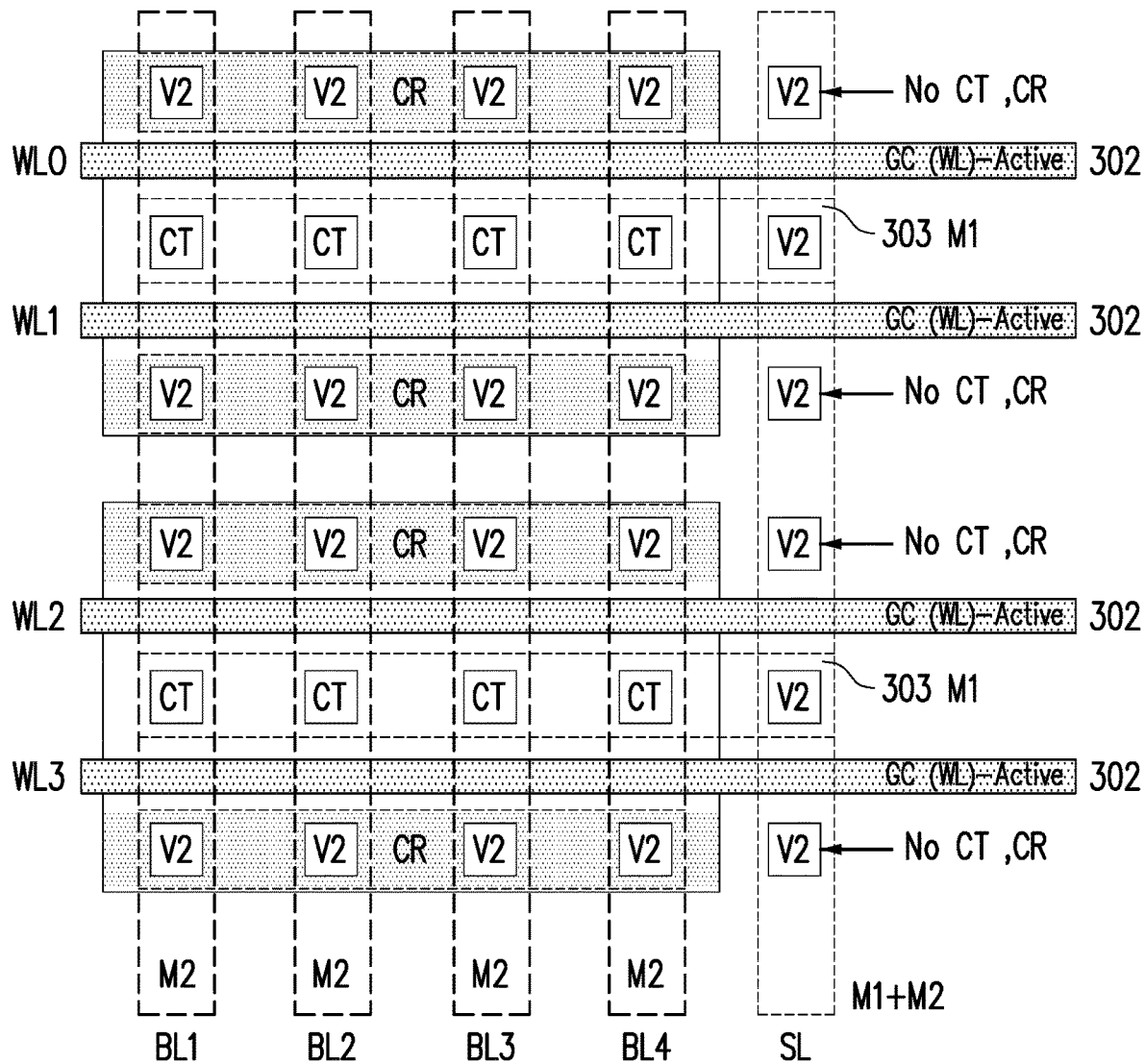
FIG. 3 illustrates an example of a layout of a plurality of 1T4R structures in accordance with the first exemplary embodiment of the disclosure.

FIG. 3 shows the top view of the layout of the plurality of 1T4R structures of FIG. 2 as an example. As seen in FIG. 3, the word lines 302 corresponds to the word lines (WL0, WL1, WL2, WL3), the bit lines (BL1, BL2, BL3, BL4) are made by a second metal layer M2, and the source line (SL) 301 is also made by M2 as SL 301 is in parallel to the bit lines (BL1, BL2, BL3, BL4). The SL 301 is connected to a transistor through a first metal layer M1 303 which is underneath M2 as SL 301 and M1 303 are connected through vias (V2). The M1 lines 303 and M2 lines are connected to transistors through transistor contacts (CT) and M2 lines are connected to resistors through resistor contacts (CR).

For the 1T4R structure, the layout associated with the 1T is fabricated to be beneath the layout of the NR which could be fabricated between any layers of metal. The NR layout could be in between any layers of metal. As in FIG. 3, the layer associated with the resistor would be fabricated beneath the layer of the resistors. As described in terms of FIG. 2, a layer of T1 would be below a first layer of R1, a second layer of R2, a third layer of R3, and a fourth layer of R4, wherein any of the first layer, the second layer, the third layer and the fourth layer could be fabricated to be between any metal layers.

Traditionally, the width of M2 lines could be the bottleneck and determines the overall size of the 1T4R structures. However, for this layout, the bit lines (BL1, BL2, BL3, BL4) are parallel to the SL 301 so that each cell requires a minimum of (n+1) M2 bit lines pitch width to form the parallel bit lines (BL1, BL2, BL3, BL4) and SL 301 architecture. By making all the bit lines (BL1, BL2, BL3, BL4) perpendicular to the SL 301 and by making the SL 301 being shared along a plurality of 1T4R structures, fewer source lines are required relative to traditional layouts so as to decrease the overall required areas. Moreover, the performance could be enhanced as pre-charge operation could be performed with greater efficiency to increase the read speed and write speed.

Figure 4:
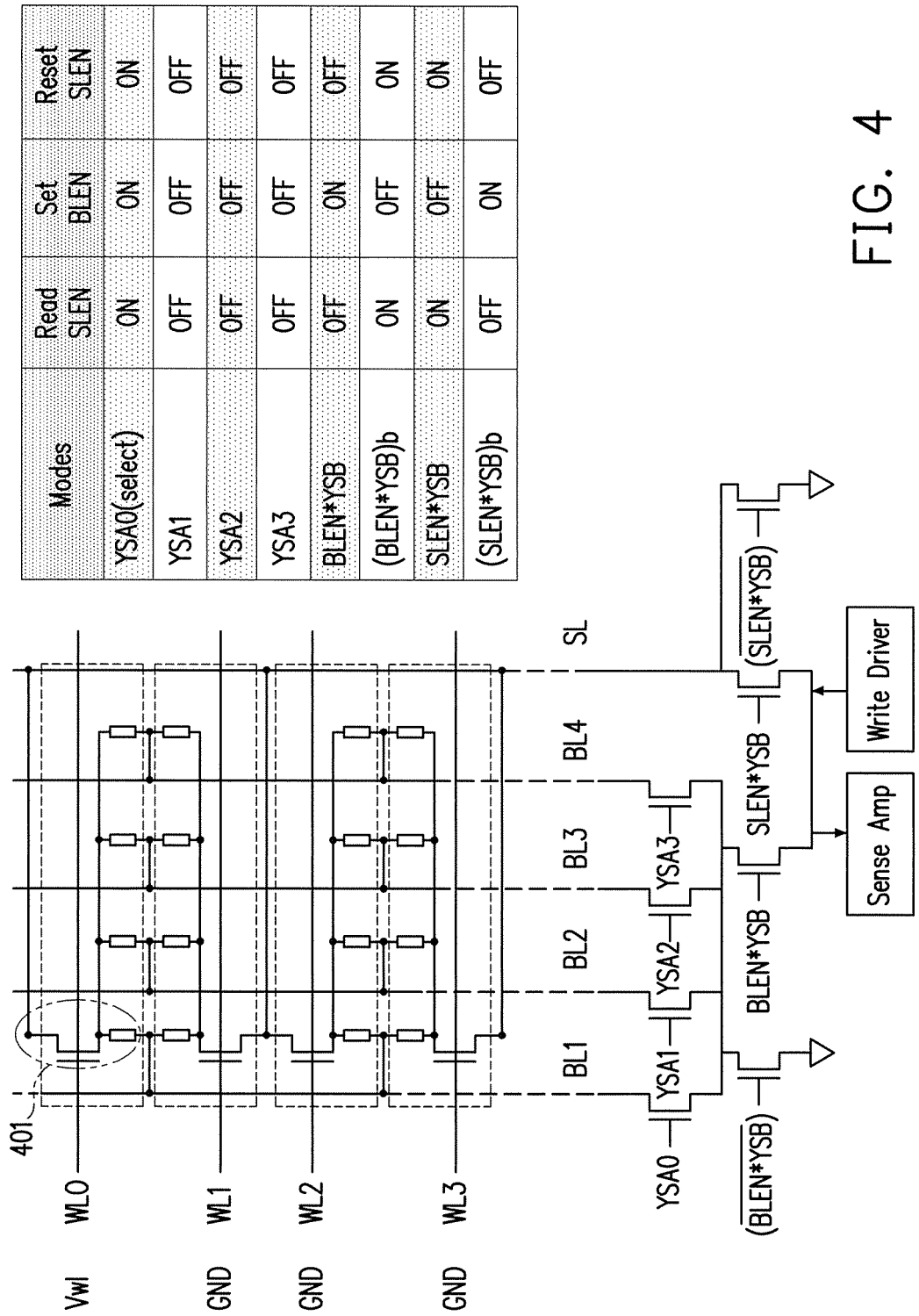
FIG. 4 illustrates a RRAM having a plurality of 1TnR structures controlled by a control structure in accordance with the first exemplary embodiment of the disclosure.

The plurality of 1TnR structures could be controlled by a control structure as seen in FIG. 4 by using a first multiplexer decoder (i.e. Y multiplexer A decoder) which is controlled by a second multiplexer decoder (i.e. Y multiplexer B decoder) which is also connected to the source line. As seen in FIG. 4, the first multiplexer decoder may include 4 transistors, and each of the 4 transistors receives one of a first set of selection signals including YSA0, YSA1, YSA2, YSA3 to control BL1, BL2, BL3, and BL4 respectively. The second multiplexer decoder may also include 4 transistors, and each of the 4 transistors receives one of a second set of selection signals including a bit line enable signal (BLEN*YSB), a bit line enable bar signal (BLEN*YSB)b, a source line enable signal (SLEN*YSB), and a source line enable bar signal (SLEN*YSB)b, respectively, to control the first multiplexer decoder. (BLEN*YSB)b is a binary opposite of (BLEN*YSB) and (SLEN*YSB)b is a binary opposite of (SLEN*YSB).

For example, BL1 could be selected by YSA0 which is a first selection signal for enabling BL1 and BL2 could be selected by YSA1 a second selection signal for enabling BL2 as whether BL1 or BL2 is enabled is according to a combination of a first set of selection signals of the first multiplexer decoder. The combination of the first set of selection signals of the first multiplexer decoder in conjunction with the combination of the second set of selection signals of the second multiplexer decoder would enable the plurality of 1T4R structures of the RRAM to select one or more cells for performing a read operation which reads the binary value of a cell, a set operation which sets a binary value of a cell, or a reset operation which resets the binary value of a cell.

Referring to the Table as shown in FIG. 4 for example, assuming that the first resistor corresponding to BL1 of the 1T4R structure 401 is to be selected for a read operation, then the first combination of selection signals and the second combination of signals as shown in the 'Read SLEN' column would configure the value of the first resistor to be read. In other words, by configuring the values of YSA0, YSA1, YSA2, YSA3 as on, off, off, off, (which could be 1, 0, 0, 0 or high, low, low, low) respectively and by configuring the values of BLEN*YSB, (BLEN*YSB)b, SLEN*YSB, (SLEN*YSB)b as off, on, on, off, respectively, the value of the first resistor of the 1T4R structure 401 could be read.

Similarly, by configuring the values of YSA0, YSA1, YSA2, YSA3 as on, off, off, off, respectively and by configuring the values of BLEN*YSB, (BLEN*YSB)b, SLEN*YSB, (SLEN*YSB)b as on, off, off, on, respectively, the value of the first resistor of the 1T4R structure 401 could be set. Also similarly, by configuring the values of YSA0, YSA1, YSA2, YSA3 as on, off, off, off, respectively and by configuring the values of BLEN*YSB, (BLEN*YSB)b, SLEN*YSB, (SLEN*YSB)b as off, on, on, off, respectively, the value of the first resistor of the 1T4R structure 401 could be reset. It is worth noting that this circuit design would lower the area required for a traditional 1T4R structure since the source line is controlled by the second multiplexer decoder and does not require an additional multiplexer decoder.

Figure 5:
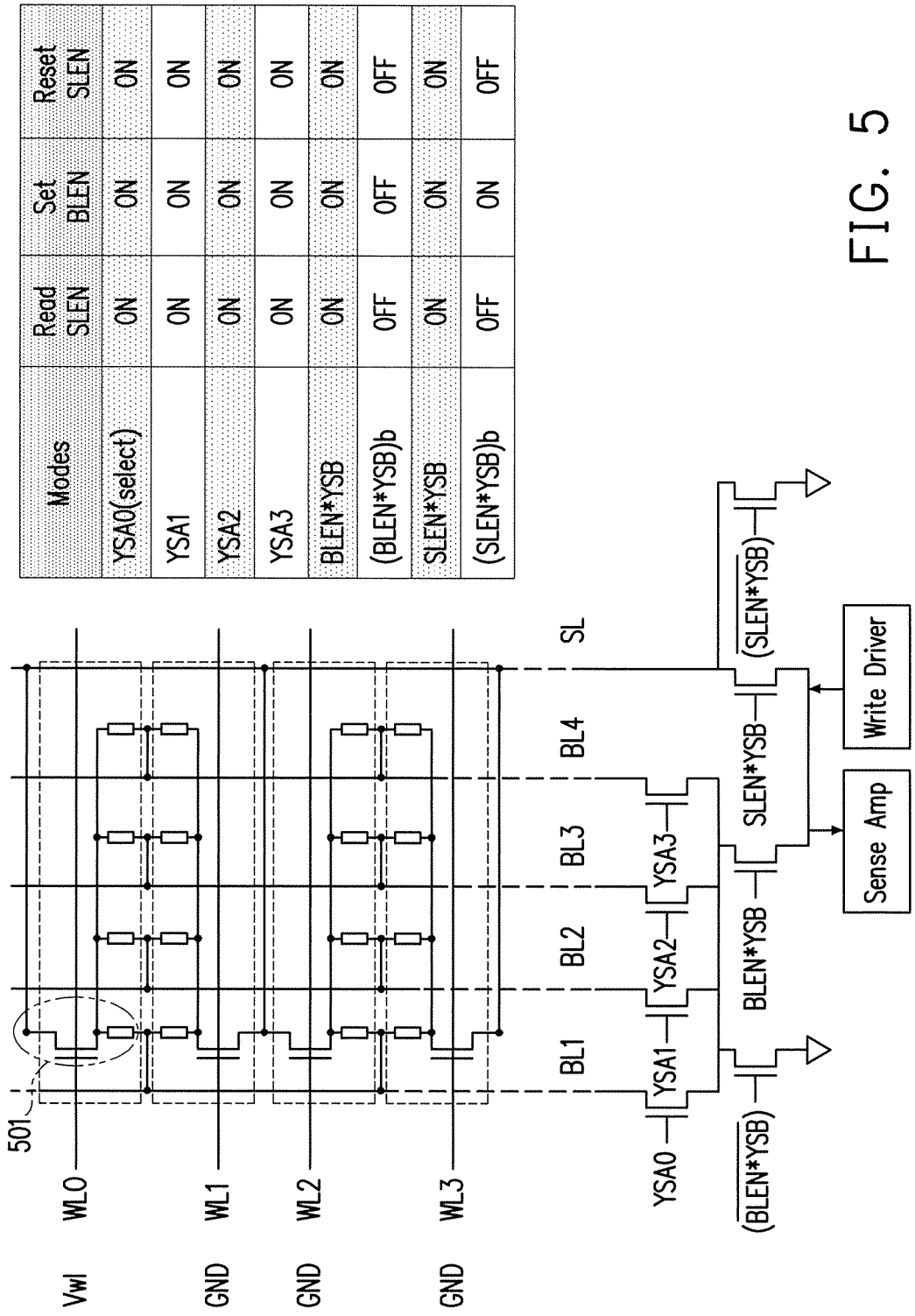
FIG. 5 illustrates using a control structure to implement various pre-charge modes in accordance with the first exemplary embodiment of the disclosure.

The same control structure of FIG. 4 could also be used to implement various pre-charge functions. As shown in FIG. 5, the control structure would also include a write driver and a sense amplifier. A read pre-charge function could be performed by setting the first combination of selection signals and the second combination of selection signals based on Table shown in FIG. 5 and by having the sense amplifier pulled up to a certain voltage level to speed up read sensing time, and a write pre-charge function could be performed by setting the first combination of selection signals and the second combination of selection signals based on Table shown in FIG. 5 and by having the write driver pulled up to a certain voltage level to speed up the set time.

For example, assuming that a read pre-charge operation is to be performed, YSA0, YSA1, YSA2, YSA3 could be configured as on, on, on, on respectively and BLEN*YSB, (BLEN*YSB)b, SLEN*YSB, (SLEN*YSB)b could be configured as on, off, on, off, respectively. The sense amplifier voltage could be pulled up, and the SL and the bit lines (BL1 BL2 BL3 BL4) can be pre-charged to a voltage level of 0V or 0.1V or 0.2 V to speed up the read sensing. For example, assuming that a write pre-charge operation is to be performed, YSA0, YSA1, YSA2, YSA3 could be configured as on, on, on, on respectively and BLEN*YSB, (BLEN*YSB)b, SLEN*YSB, (SLEN*YSB)b could be configured as on, off, on, off, respectively. The write driver voltage could be pulled up, and the SL and the bit lines (BL1 BL2 BL3 BL4) can be pre-charged to a voltage level of 2V to speed up the set time.

Figure 6:
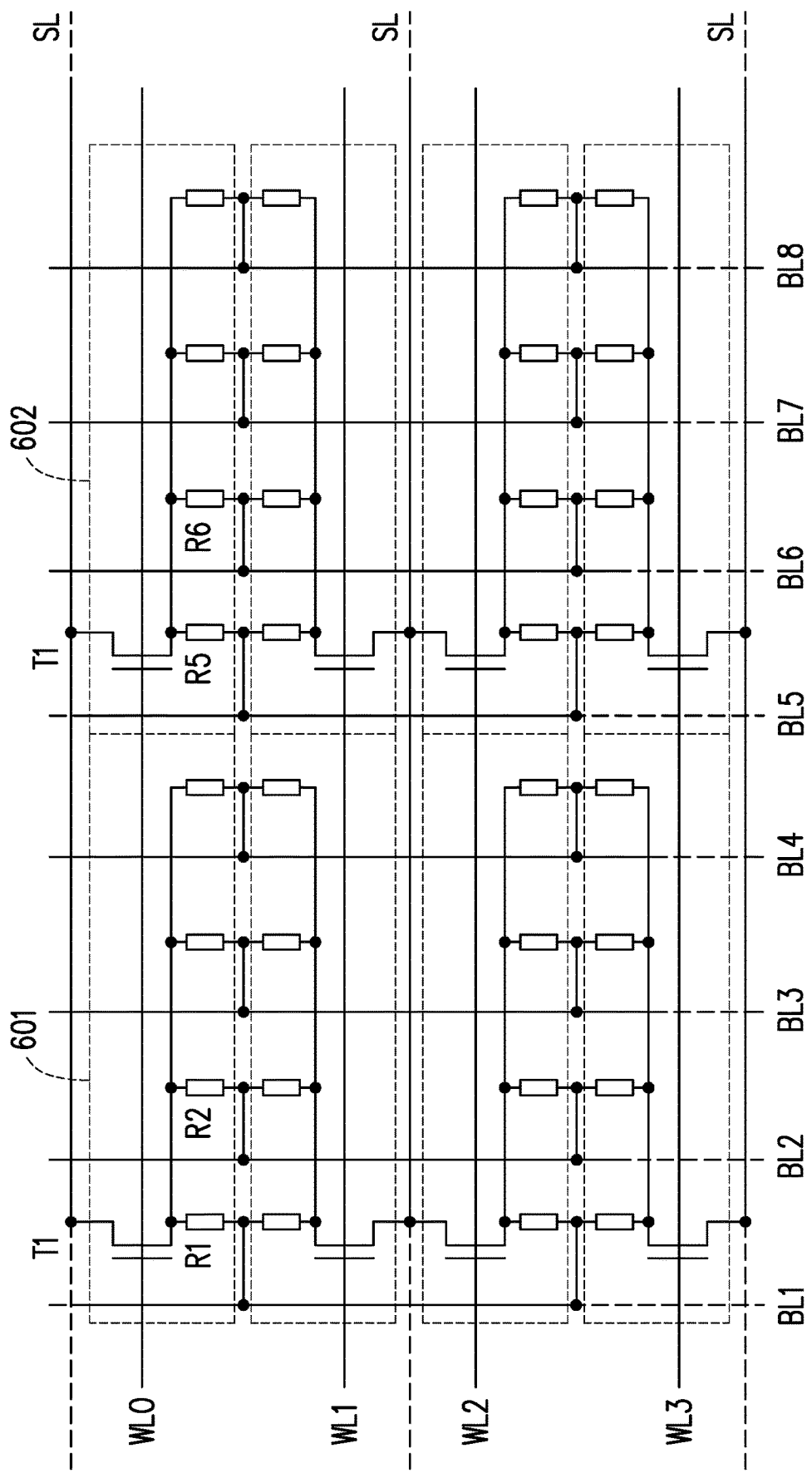
FIG. 6 illustrates a RRAM having a plurality of 1T4R structures in accordance with a second exemplary embodiments of the disclosure.

FIG. 6 shows a RRAM having a plurality of 1T4R structures based on the first exemplary embodiment of the disclosure. The RRAM of FIG. 6 includes multiple 1T4R structures which include not limited to a first 1TnR structure 601 and a second 1TnR structure 602 connected to the first 1TnR structure in parallel. The first 1TnR structure 601 could be a part of a first group of 1TnR structures connected in series as each of the first group of 1TnR structures is connected to a different word line (i.e. WL0, WL1, WL2, WL3). The second 1TnR structure 602 could also be a part of a second group of 1TnR structures connected in series as each of the second group of 1TnR structures is connected to a different word line (i.e. WL0, WL1, WL2, WL3).

Each of the 1TnR structure of the first group of 1TnR structures would include R resistors as each of the R resistors is connected to a different bit line. Assuming that n=4, then the 4 resistors of each of the 1TnR structures of the first group of 1TnR structures is connected to bit lines BL1, BL2, BL3, and BL4 respectively. Also, the 4 resistors of each of the 1TnR structures of the second group of 1TnR structures is connected to bit lines BL5, BL6, BL7, and BL8 respectively. All the 1TnR structures of the first group of 1TnR structures and the second group of 1TnR structures are connected to a common SL.

In further detail, the first 1TnR structure 601 includes a first transistor T1 which includes a first gate terminal connected to a first word line WL0, a first drain terminal, and a first source terminal connected to a common SL. The common SL is directly connected to a source line of the second 1TnR structure 602. The first 1TnR structure includes a first n parallel resistors group including a first resistor R1 and a second resistor R2 which are connected to the first drain terminal and connected to each other in parallel. The first resistor R1 is connected to a first bit line BL1, the second resistor R2 is connected to a second bit line BL2. The number n could be any an integer greater than one.

The second 1TnR structure 602 would include a second gate terminal connected to a second word line, a second drain terminal, and a second source terminal connected to the common SL. The second 1TnR structure 602 would also include a second n parallel resistors group including a third resistor R5 and a fourth resistor R6 which are connected to the second drain terminal and connected to each other in parallel. The third resistor R5 is connected to the third bit line BL5, and the fourth resistor R6 is connected to a fourth bit line BL6. Similar to the first exemplary embodiment, each of the first resistor R1, the second resistor R2, the third resistor R5, and the fourth resistor R6 has a low impedance when selected and high impedance when unselected.

Figure 7:
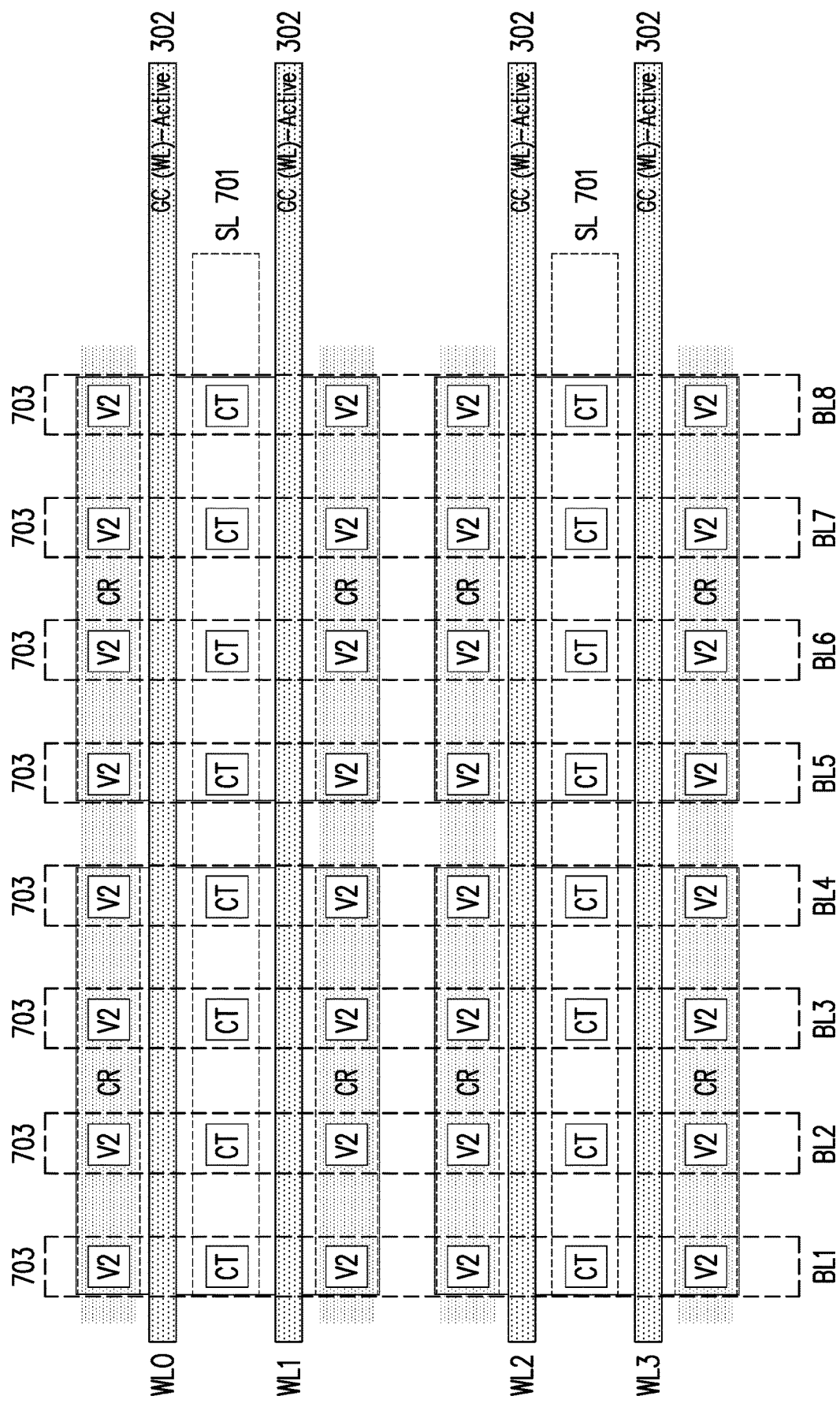
FIG. 7 illustrates an example of a layout of a plurality of 1T4R structures in accordance with the second exemplary embodiment of the disclosure.

FIG. 7 illustrates the top view of the layout of the plurality of 1T4R structures of FIG. 6 as an example. As seen in FIG. 7, the word lines 302 corresponds to the word lines (WL0, WL1, WL2, WL3), the bit lines (BL1, BL2, BL3, BL4, BL5, BL6, BL7, BL8) are made by a second metal layer M2, but the SL 701 is also made by M1 as SL 301 is in perpendicular to the bit lines (BL1, BL2, BL3, BL4, BL5, BL6, BL7, BL8). M1 is underneath M2. The SL 801 which is made by M1 is connected to a transistor through transistor contacts (CT), and each of the bit lines (BL1, BL2, BL3, BL4, BL5, BL6, BL7, BL8) is connected to a transistor through transistor contacts (CT) and connected to resistors through resistor contacts (CR).

For the 1T4R structure, the layout associated with the 1T is fabricated to be beneath the layout of the NR which could be fabricated between any layers of metal. The NR layout could be in between any layers of metal. As in FIG. 7, the layer associated with the resistor would be fabricated beneath the layer of the resistors. As described in terms of FIG. 6, a layer of T1 would be below a first layer of R1, a second layer of R2, and a layer of T2 would be below a third layer of R3, and a fourth layer of R4, wherein any of the first layer, the second layer, the third layer and the fourth layer could be fabricated to be between any metal layers.

Traditionally, the width of M2 lines could be the bottleneck and determines the overall size of the 1T4R structures. However, for this layout, the bit lines (BL1, BL2, BL3, BL4, BL5, BL6, BL7, BL8) are perpendicular to the SL 701 so that each cell requires a minimum of (n) M2 bit lines pitch width to form a 1TnR structure with common SL architecture. By having a common SL share among many 1TnR structures, fewer source lines are required relative to traditional layouts so as to decrease the overall required areas. Moreover, the performance could be enhanced as pre-charge operation could be performed with greater efficiency to increase the read speed and write speed.

Figure 8:
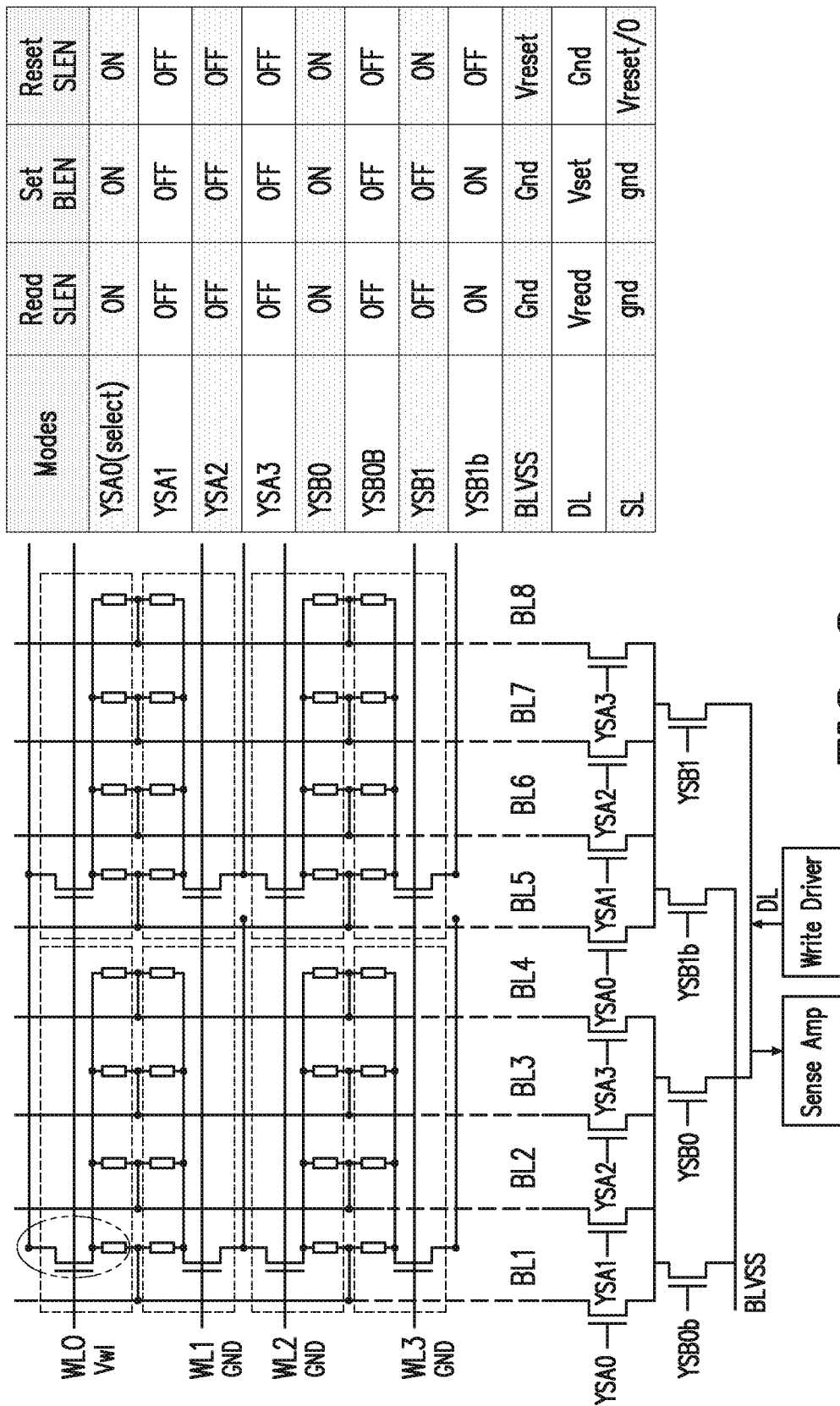
FIG. 8 illustrates a RRAM having a plurality of 1TnR structures controlled by a control structure in accordance with the second exemplary embodiment of the disclosure.

FIG. 8 illustrates a RRAM having a plurality of 1TnR structures controlled by a control structure in accordance with the second exemplary embodiment of the disclosure. The control structure includes not limited to a first multiplexer decoder, a second multiplexer decoder, a sense amplifier, and a write driver. Assuming that n=4, the first multiplexer decoder may then include a first group of four transistors connected to BL1, BL2, BL3, and BL4 respectively and a second group of four transistors connected to BL5, BL6, BL7, and BL8 respectively. The four transistors of the first group would receive a first combination of selection signals, YSA0, YSA1, YSA2, and YSA3, and the four transistors of the second group would receive the first combination of selection signals, YSA0, YSA1, YSA2, and YSA3.

The first group of four transistors is controlled by two transistors of the second multiplexer decoder, and the two transistors of the second multiplexer decoder respectively receives YSB0 and (YSB0)b which are a part of the second combination of selection signals. Similarly, The second group of four transistors is controlled by two transistors (i.e. YSB0 transistors) of the second multiplexer decoder, and the two transistors (i.e. YSB1 transistors) of the second multiplexer decoder respectively receives YSB1 and (YSB1)b which are also a part of the second combination of selection signals. The first YSB0 transistor and the first YSB1 transistor is controlled by a BLVSS signal and the second YSB0 transistor and the second YSB1 transistor is controlled by a DL signal. The BLVSS, DL, and SL are also a part of the second combination of selection signals. Therefore, the YSB0 transistors of the second multiplexer decoder would control the first group of four transistors of the first multiplexer decoder, and the YSB1 transistors of the second multiplexer decoder would control the second group of four transistors of the first multiplexer decoder.

For example, the BL1 could be selected by YSA0 which is a first selection signal for enabling BL1, and BL2 could be selected by YSA1 which is a second selection signal for enabling the BL2 as a combination of a first set of selection signals of the first multiplexer decoder would select a bit line. The combination of the first set of selection signals of the first multiplexer decoder in conjunction with the combination of the second set of selection signals of the second multiplexer decoder would enable the plurality of 1T4R structures of the RRAM to select one or more cells for performing a read operation which reads the binary value of a cell, a set operation which sets a binary value of a cell, or a reset operation which resets the binary value of a cell.

Referring to the Table as shown in FIG. 8 for example, assuming that the first resistor corresponding to the first bit line BL1 of the 1T4R structure 801 is to be selected for a read operation, then the first combination of selection signals and the second combination of signals as shown in the 'Read' column would configure the value of the first resistor to be read. In other words, by configuring the values of YSA0, YSA1, YSA2, YSA3 as on, off, off, off, (which could be 1, 0, 0, 0 or high, low, low, low) respectively and by configuring the values of YSB0, (YSB)b, YSB1, (YSB1)b as on, off, off, on, respectively, as well as the values of BLVSS, DL, and SL as Gnd, Vread, and gnd, respectively, the value of the first resistor of the 1T4R structure 801 could be read.

Similarly, by configuring the values of YSA0, YSA1, YSA2, YSA3 as on, off, off, off, respectively and by configuring the values of YSB0, (YSB)b, YSB1, (YSB1)b as on, off, off, on, respectively, as well as the values of BLVSS, DL, and SL as Gnd, Vset, and gnd, respectively, the value of the first resistor of the 1T4R structure 801 could be set. Also similarly, by configuring the values of YSA0, YSA1, YSA2, YSA3 as on, off, off, off respectively and by configuring the values of YSB0, (YSB)b, YSB1, (YSB1)b as on, off, on, off, respectively, as well as the values of BLVSS, DL, and SL as Vreset, Gnd, and Vreset/0, respectively, the value of the first resistor of the 1T4R structure 801 could be reset.

It is worth noting that this circuit design would lower the area required for a traditional 1T4R structure since the SL is not required to be controlled by a multiplexer. Also, the pre-charge functions could be performed in a similar manner as the first exemplary embodiment by setting the first combination of selection signals and the second combination of selection signals based on a predetermined table and by having the sense amplifier pulled up to a certain voltage level to speed up read sensing, and a write pre-charge function could also be performed by setting the first combination of selection signals and the second combination of selection signals based on the predetermined table and by having the write driver pulled up to a certain voltage level to speed up the set time.

In view of the aforementioned descriptions, the disclosure is suitable for being used in RRAM and is able to further reduce a cell size of a 1TnR structure by changing the circuit architecture and the corresponding layout so as to further achieve device miniaturization.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A resistive random-access memory (RRAM) comprising a plurality of one transistor n resistors (1TnR) structures comprising a first 1TnR structure comprising:
   a first transistor comprising a first gate terminal connected to a first word line, a first drain terminal, and a first source terminal connected to a source line, wherein the source line is connected to each of the plurality of 1TnR structures; and a first n parallel resistors group comprising a first resistor and a second resistor which are connected to the first drain terminal and connected to each other in parallel, wherein the first resistor is connected to a first bit line, the second resistor is connected to a second bit line, and n is an integer greater than one.

2. The RRAM of claim 1, wherein the plurality of 1TnR structures further comprising:
a second transistor comprising a second gate terminal connected to a second word line, a second drain terminal, and a second source terminal connected to the source line; and
a second n parallel resistors group comprising a third resistor and a fourth resistor which are connected to the second drain terminal and connected to each other in parallel, wherein the third resistor is connected to the first bit line, the fourth resistor is connected to the second bit line, the third resistor shares the first bit line with the first resistor, and the fourth resistor shares the second bit line with the second resistor.

3. The RRAM of claim 2, wherein each of the first bit line and the second bit line are connected to a different terminal of a first multiplexer decoder, and one of the first bit line and the second bit line is configured to be enabled according to at least a combination of a first set of selection signals of the first multiplexer decoder.

4. The RRAM of claim 3, wherein the first multiplexer decoder is connected to a second multiplexer decoder which is also connected to the source line, and one of the first bit line and the second bit line is configured to be enabled further according to a combination of a second set of selection signals of the second multiplexer decoder.

5. The RRAM of claim 4, wherein first set of selection signals of the first multiplexer decoder comprising a first selection signal for enabling the first bit line and a second selection signal for enabling the second bit line.

6. The RRAM of claim 5, wherein the second multiplexer decoder is configured to control the first multiplexer decoder and the source line according to the combination of the second set of selection signals of the second multiplexer decoder, wherein the second set of selection signals comprising a bit line enable signal and a source line enable signal.

7. The RRAM of claim 6, wherein the first bit line is read by setting the first selection signal as on, by setting the bit line enable signal as off, and by setting the source line enable signal as on.

8. The RRAM of claim 6, wherein the first bit line is set by setting the first selection signal as on, by setting the bit line enable signal as on, and by setting the source line enable signal as off.

9. The RRAM of claim 6, wherein the first bit line is reset by setting the first selection signal as on, by setting the bit line enable signal as off, and by setting the source line enable signal as on.

10. The RRAM of claim 2, wherein a layer of the first transistor is below a first layer of the first resistor, a second layer of the second resistor, a third layer of the third resistor, and a fourth layer of the fourth resistor, wherein any of the first layer, the second layer, the third layer and the fourth layer is between any metal layers.

11. A resistive random-access memory (RRAM) comprising a plurality of one transistor n resistors (1TnR) structures comprising a first 1TnR structure and a second 1TnR structure connected to the first 1TnR structure in parallel, wherein the first 1TnR structure comprising:

a first transistor comprising a first gate terminal connected to a first word line, a first drain terminal, and a first source terminal connected to a source line, wherein the source line is connected to the second 1TnR structure; and
a first n parallel resistors group comprising a first resistor and a second resistor which are connected to the first drain terminal and connected to each other in parallel, wherein the first resistor is connected to a first bit line, the second resistor is connected to a second bit line, and n is an integer greater than one.

12. The RRAM of claim 11, wherein the second 1TnR structure comprising:
a second gate terminal connected to a second word line, a second drain terminal, and a second source terminal connected to the source line; and
a second n parallel resistors group comprising a third resistor and a fourth resistor which are connected to the second drain terminal and connected to each other in parallel, wherein the third resistor is connected to a third bit line, the fourth resistor is connected to a fourth bit line.

13. The RRAM of claim 12, wherein each of the first bit line and the second bit line are connected to a different terminal of a first multiplexer decoder, and one of the first bit line and the second bit line is configured to be enabled according to at least a combination of a first set of selection signals of the first multiplexer decoder.

14. The RRAM of claim 13, wherein the first multiplexer decoder is connected to a second multiplexer decoder, and one of the first bit line and the second bit line is configured to be enabled further according to a combination of a second set of selection signals of the second multiplexer decoder.

15. The RRAM of claim 14, wherein first set of selection signals of the first multiplexer decoder comprising a first selection signal for enabling the first bit line and a second selection signal for enabling the second bit line.

16. The RRAM of claim 15, wherein the second multiplexer decoder is configured to control the first multiplexer decoder and the source line according to the combination of the second set of selection signals of the second multiplexer decoder, wherein the second set of selection signals comprising a first multiplexer enable signal and a second multiplexer enable signal.

17. The RRAM of claim 16, wherein the first bit line is read by setting the first selection signal as on, by setting the first multiplexer enable signal as on, and by setting the second multiplexer enable signal as off.

18. The RRAM of claim 16, wherein the first bit line is set by setting the first selection signal as on, by setting the first multiplexer enable signal as on, and by setting the second multiplexer enable signal as off.

19. The RRAM of claim 16, wherein the first bit line is reset by setting the first selection signal as on, by setting the first multiplexer enable signal as on, and by setting the second multiplexer enable signal as on.

20. The RRAM of claim 12, wherein a layer of the first transistor is below a first layer of the first resistor, a second layer of the second resistor, and a layer of the second transistor is below a third layer of the third resistor, and a fourth layer of the fourth resistor, wherein any of the first layer, the second layer, the third layer and the fourth layer is between any metal layers.

* * * * *